May 5, 1942. R. B. ALBRIGHT Re. 22,087

TUNING CONTROL DEVICE FOR RADIO RECEIVERS AND THE LIKE

Original Filed April 13, 1938 3 Sheets-Sheet 1

Inventor:-
Robert B. Albright
by his Attorneys
Howson & Howson

May 5, 1942. R. B. ALBRIGHT Re. 22,087

TUNING CONTROL DEVICE FOR RADIO RECEIVERS AND THE LIKE

Original Filed April 13, 1938 3 Sheets-Sheet 2

Inventor:—
Robert B. Albright
by his Attorneys
Howson & Howson.

TUNING CONTROL DEVICE FOR RADIO RECEIVERS AND THE LIKE

Original Filed April 13, 1938 3 Sheets-Sheet 3

Inventor:-
Robert B. Albright
by his Attorneys
Howson & Howson

Reissued May 5, 1942

Re. 22,087

UNITED STATES PATENT OFFICE 22,087

TUNING CONTROL DEVICE FOR RADIO RECEIVERS AND THE LIKE

Robert B. Albright, Philadelphia, Pa., assignor, by mesne assignments, to Philco Radio and Television Corporation, Philadelphia, Pa., a corporation of Delaware Original No. 2,211,041, dated August 13, 1940, Serial No. 201,821, April 13, 1938. Application for reissue April 18, 1941, Serial No. 389,258

17 Claims. (Cl. 250—40)

This invention relates to tuning control devices for radio receivers and the like, and more particularly to a novel control device for a multi-band radio receiver, that is, a receiver adapted to receive signals in a plurality of different frequency bands.

One object of the invention is to provide a novel control device constructed and arranged to provide substantially complete push button control operation of a radio receiver, particularly a receiver of the multi-band type.

A more specific object of the invention is to provide a radio receiving system which may be tuned in the usual manner by varying the setting of the tuning elements and which may also be tuned by means of a push button control mechanism, and to provide means for automatically extinguishing the usual dial lamp whenever push button operation is initiated.

Another object of the invention is to provide push button control means for adapting the radio receiver for the reception of signals in a selected frequency band or for the reception of a particular channel, the several control means being both mechanically and electrically interlocked to avoid deleterious capacity effects of certain parts of the mechanism.

A further object of the invention is to provide in combination with the push button controls abovementioned a further push button control for the "off" and "on" switch controlling the energization of the receiver, this push-button controlled switch functioning cooperatively with the other push-button controls as described more fully hereinafter.

Other objects and features of the invention will be apparent as the description proceeds.

Figure 1:
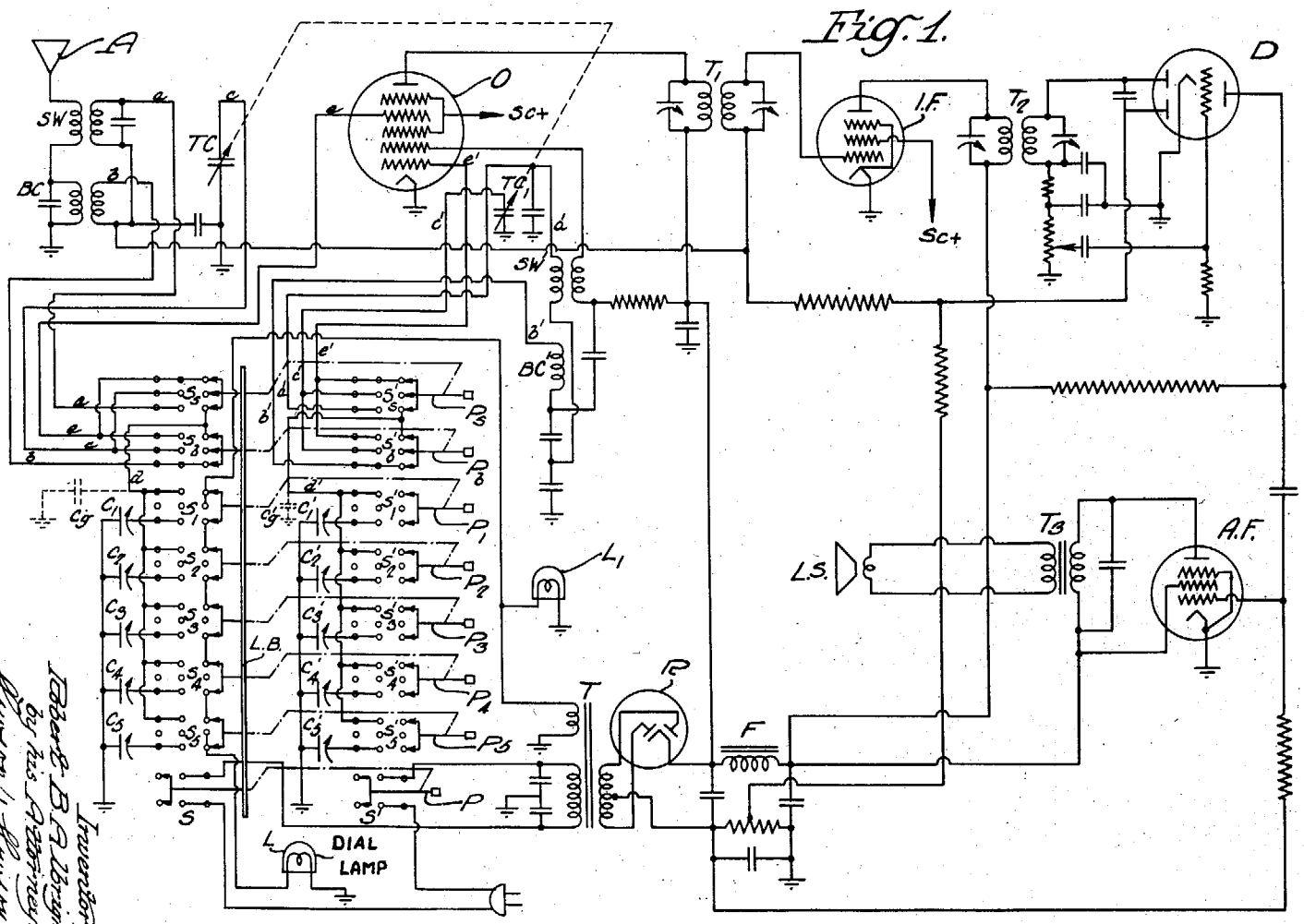
Fig. 1 is a diagrammatic illustration of a multi-band superheterodyne radio receiver embodying one form of the novel control mechanism of the invention.

Referring to Fig. 1 there is shown an antenna A which supplies the incoming signals to the usual detector-oscillator O, from which the signal energy passes through the usual successive stages of the conventional superheterodyne receiver including an intermediate frequency amplifier IF, a double diode-triode detector D, an audio frequency amplifier AF, and the usual loud speaker LS. The manner in which such a receiver operates is well understood, and it is, therefore, unnecessary to refer to the operation further than is necessary to describe the control mechanism of the invention.

The radio receiver illustrated is supplied with electrical energy by means of the usual power supply system including transformer T, rectifier R, and filter F. The energization of the receiver is controlled in a particular manner, however, by the push button control mechanism, as will be described later.

For manual tuning of the receiver, there are provided the ganged tuning condenser TC and $TC_1$ which serve to vary the tuning of the circuits associated with the detector-oscillator stage, as will be well understood. To enable manual tuning of the receiver, the usual tuning dial of some suitable form will be provided and a dial lamp L will be cooperatively associated with the tuning dial to facilitate manual tuning in accordance with common practice. The dial mechanism is not shown in Fig. 1, since the construction and manner of operation of such a mechanism is well understood. The dial lamp L, however, plays a part in the practice of the present invention, as will be explained presently.

The radio receiver illustrated is of the multi-band type, and in accordance with common practice there are provided selectable channels, BC and SW, for transferring signals in the different wave bands from the antenna A to the detector-oscillator O. The oscillator circuits BC′ and SW′ are also adapted for operation in the same frequency bands. In any system of this character, some suitable means are provided for selecting one of the channels and for connecting the oscillator circuits accordingly. In the present instance, the necessary switching operations to adapt the receiver for operation in the selected frequency bands are effected by means of the push button control mechanism now to be described. In addition, this mechanism controls the connection of the tuning condensers TC and $TC_1$. Hence, the receiver may be adapted for the usual manual adjustment tuning or for push button tuning.

The push button control mechanism provided by the invention comprises two groups of switches constructed and arranged for operation in pairs by push buttons; that is to say, the switches of one row or group correspond to the switches of the other row, and corresponding pairs of switches are arranged for tandem operation, each such pair of switches being operated by a single push button. In Fig. 1, the switches are illustrated diagrammatically in correspondence to the mechanical structure shown in Figs. 2 to 4 and described hereinafter.

The two switches $S_s$ and $S'_s$ serve to control the short wave band connections, while the switches $S_b$ and $S'_b$ serve to control the broadcast band connections. These two pairs of switches are operated respectively by the push buttons $P_s$ and $P_b$, the tandem operation of the switches being designated by the broken line connections.

The switches $S_1$, $S_2$ and $S_3$, etc., and the associated switches $S_1'$, $S_2'$, $S_3'$, etc. serve to control the tuning of the radio receiver to predetermined signals in the broadcast band, the respective pairs of these switches being operated by the push button elements $P_1$, $P_2$, $P_3$, etc. It will be noted that the switches $S_1$, $S_2$, $S_3$, etc. control the connection of tuned circuits including the condensers $C_1$, $C_2$, $C_3$, etc., while the switches $S_1'$, $S_2'$, $S_3'$, etc. control the connection of tuned circuits including the condensers $C_1'$, $C_2'$, $C_3'$, etc.

The switches S and S′, operated by the element P control the energization of the radio receiver, these switches being serially connected in the primary circuit of the power transformer T.

The various push button-controlled switches are generally similar in structure, at least to the extent that each comprises a plurality of stationary contacts designated by the small circles and the permanent connections therebetween, and a movable contact member carrying a plurality of contacts, designated by arrow heads, which engage the stationary contacts. As will be described in further detail later, a common latch bar LB serves to latch any one of the push button elements in depressed position, and is arranged so that the actuation of any other element releases the previously-depressed element. Consequently, at any one time, only one of the push button elements will be in depressed position.

It will be noted that the switches S and S′ are open when the push button element P is depressed and are closed when this element is in non-depressed position. Therefore, in order to deenergize the radio receiver, push button P is depressed to open the switches S and S′. Assuming that the radio receiver is thus deenergized, when any one of the other push buttons is depressed to operate the receiver, the push button P is automatically released and moves to switch-closing position, so that the receiver is automatically energized.

It will be noted further that the energizing circuit for the dial lamp L includes the back contacts of switches $S_1$, $S_2$, $S_3$, $S_4$ and $S_5$. Therefore, the dial lamp is energized only when all of the push-buttons $P_1$, $P_2$, $P_3$, $P_4$ and $P_5$ are in non-actuated position. When any one of these station selecting push buttons is depressed, however, the energizing circuit of the dial lamp L is opened, so that the lamp is deenergized during push button station selecting operation. At such time, the tuning dial is not employed and the illumination of the dial is unnecessary. This feature of the invention gives an indication of the condition of adjustment, prolongs the life of the dial lamp, and effects an economy in the current consumption of the lamp.

When the channel-selecting switches are in the positions shown, the receiver is adapted for push button operation in the broadcast range, for the broadcast channels BC and BC′ are completed, the tuning condensers TC and $TC_1$ are disconnected, and the circuits of the push button-controlled condensers are connected to the signal channel. These connections obtain by reason of the connection of the conductor *b*, the grid lead *e* and the common connector *d* for the switches $S_1$, $S_2$, etc. and the corresponding connection of the oscillator connections. The actuation of any one of the station selecting push buttons $P_1$, $P_2$, $P_3$, etc. will close the corresponding tuned circuits, thus tuning the receiver to the particular broadcast signal represented by the actuated push button. Different signals in the broadcast band may be received successively by successive operation of the station selecting push buttons. During the entire operation of the radio receiver, the push button P will remain in non-actuated position, so that the receiver will be constantly energized. When it is desired to deenergize the receiver, the push button P is depressed to open the switches S and S′.

Preferably, there is provided a lamp $L_1$ arranged cooperatively with the push button mechanism for indicating the condition of the push buttons in any instance. For example, an arrangement such as shown in the copending application of Leslie J. Woods, Serial No. 179,602, filed December 13, 1937 may be employed to indicate the operative push button in any instance as distinguished from the non-actuated push buttons. For the purpose of the present application, it suffices to state that such arrangement employs one or more lamps as a source of illumination for the push button indicators. The lamp $L_1$ which is constantly energized by transformer T is representative of such source.

When it is desired to manually tune the radio receiver to stations in the broadcast band by adjustment of the tuning condensers TC and $TC_1$, the push button $P_b$ is depressed, which causes connection of the tuning condensers TC and $TC_1$, or in other words connection of leads *b*, *c* and *e* and the corresponding oscillator connections. At the same time, the dial lamp circuit is energized.

When the operator desires to receive signals in the short wave band, he depresses the push button $P_s$, causing the release of push button $P_b$. The short wave switches $S_s$ and $S_s'$ disconnect the broadcast band connections and connect the short wave channel SW to the input circuit of tube O and also connect the short wave circuit SW′. The tuning condensers TC and $TC_1$ are also connected to the signal channel for operation. In other words, leads *a*, *c* and *e* are connected together and the corresponding oscillator leads are connected. In this instance also, the dial lamp will be illuminated and the receiver may be manually tuned in the customary manner, by adjusting the tuning condensers.

Figure 2:
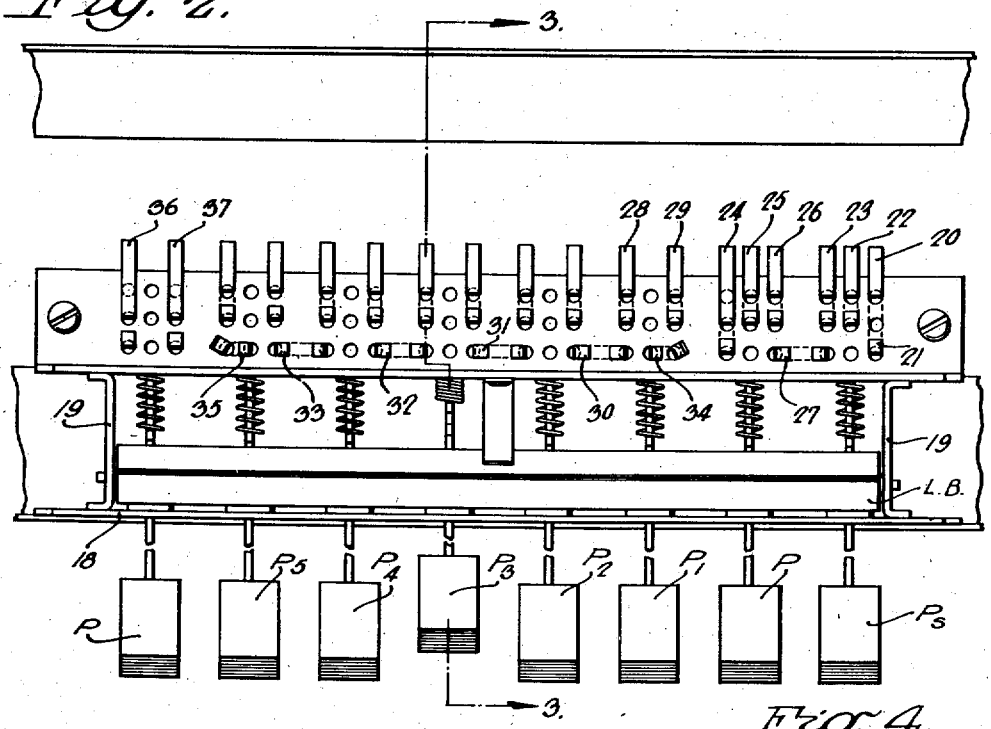
Fig. 2 is a plan view of the switching mechanism employed.
Figure 4:
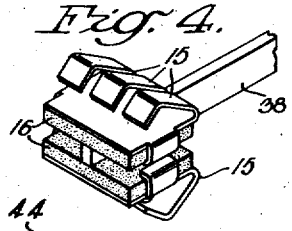
Fig. 4 is a fragmentary perspective view of a switch element.
Figure 3:
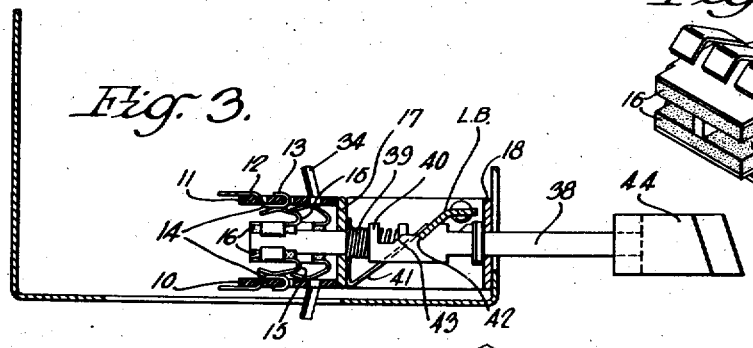
Fig. 3 is a sectional view taken along line 3—3 of Fig. 2.

The push button mechanism preferably is constructed as illustrated in Figs. 2 to 4. A pair of spaced insulating strips 10 and 11 serve to support the stationary contact elements of the respective groups of switches, these contact elements being in the form of flexible metal strips which are inserted through openings in the insulating strips and bent to secure them in place. To simplify the manufacture of the structure, each of the insulating strips may have punched therein a plurality of similar sets of holes, one set for each switch. Each set of holes consists of three rows of three holes each making a total of nine holes for each switch, as may be seen in Fig. 2. While some of these holes are not used, it is cheaper to punch similar sets of openings by means of similar punches than it would be to punch different sets of openings employing different punches. The manner in which the metal strips are inserted in the holes of the insulating strips and bent may be seen from the sectional view of Fig. 3 wherein it will be seen that the strips 12 are inserted through the rear holes and then through the intermediate holes and have their forward ends 13 bent over to secure them in place. There are thus provided portions 14 which are engaged by spring fingers 15 carried by the associated plunger or push button element and insulated therefrom by means of insulating blocks 16. The manner in which the rear end of a plunger or push button element is constructed to provide the wiping contacts is illustrated in Fig. 4. The insulating strips 10 and 11 are carried by a wall 17 which is secured to the front wall 18 by means of brackets 19.

The spring finger wiper at the bottom of each push button element and the lower set of stationary contacts engaged by such wiper constitutes one switch of a pair, while the upper wiper and the upper set of contacts engaged thereby constitutes the other switch of the pair. In this manner, the switches are arranged in pairs, each pair of switches being operated by a single push button element as described above in connection with Fig. 1.

Referring to Fig. 2 and considering the manner in which the various switches and their connections are formed, it will be seen that each of the switches $S_s$ and $S_s'$, comprises a strip 20 which is inserted through a rear hole and then through the corresponding front hole with its end 21 bent over as illustrated. This switch also comprises strips 22 and 23, as illustrated. The associated switches $S_b$ and $S_b'$ are similarly formed, each comprising a long strip 24 corresponding to strip 20 and two short strips 25 and 26 corresponding to strips 22 and 23. The adjacent front holes of the two switch section support a connecting strip 27.

Each of the ten station selecting switches $S_1$, $S_1'$, $S_2$, $S_2'$, etc. comprises two contact strips 28 and 29 inserted through the rear and intermediate openings of the outer rows of holes, as shown in Fig. 2. The switches $S_1$, $S_2$, $S_3$, $S_4$, and $S_5$ are also connected together by link strips 30, 31, 32 and 33. The switches $S_1$ and $S_5$ are further provided with terminal links 34 and 35. These connecting links and terminals provide for the series connection of the switches in the dial lamp circuit, as illustrated in Fig. 1.

The switches S and S' each comprises a pair of contact strips 36 and 37 which are inserted through the intermediate and front openings of the outer rows of holes, as shown in Fig. 2. These switches are thus constructed so that they are closed when the push button P is in its outer or non-actuated position.

Each of the push button elements comprises a rod 38 slidably carried by the spaced walls 17 and 18. Each of these elements is urged to its outer or non-actuated position by a spring 39 disposed between the wall 17 and a lug or projection 40 on the push rod. The latch bar LB above mentioned is pivotally carried by the brackets 19 and is urged in the counter-clockwise direction, as viewed in Fig. 3, by the leaf spring 41. Each of the push rods has a shoulder detent 42, formed therein for cooperation with the latch bar to hold a depressed push rod in latched position against the action of its spring, as shown in Fig. 3. There is also formed on each push rod a cam face 43 which deflects the latch bar when the push button element is actuated. This releases any previously depressed push button element. Each of the push rods carries at its outer end a head 44 which may be actuated by a finger of the operator, the front face of the head preferably being inclined or slanted as illustrated.

Figure 5:
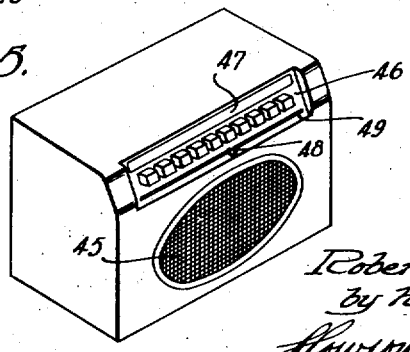
Fig. 5 is a perspective view of a radio receiver embodying the control mechanism.

In Fig. 5, there is illustrated a small radio receiver embodying the push button mechanism which is mounted above the speaker grill 45. The push button elements extend through an inclined panel 46 and directly above the push buttons, there is a straight dial 47, the pointer of which moves back and forth across the dial as the tuning knob 48 is moved in its slot 49, as will be well understood. The knob 48 is moved to tune the receiver manually in the usual manner when it is not desired to employ the push buttons. During this manual tuning, the dial lamp associated with the dial 47 will be illuminated, but when the push button operation is initiated, the dial lamp is extinguished as described above.

Figure 6:
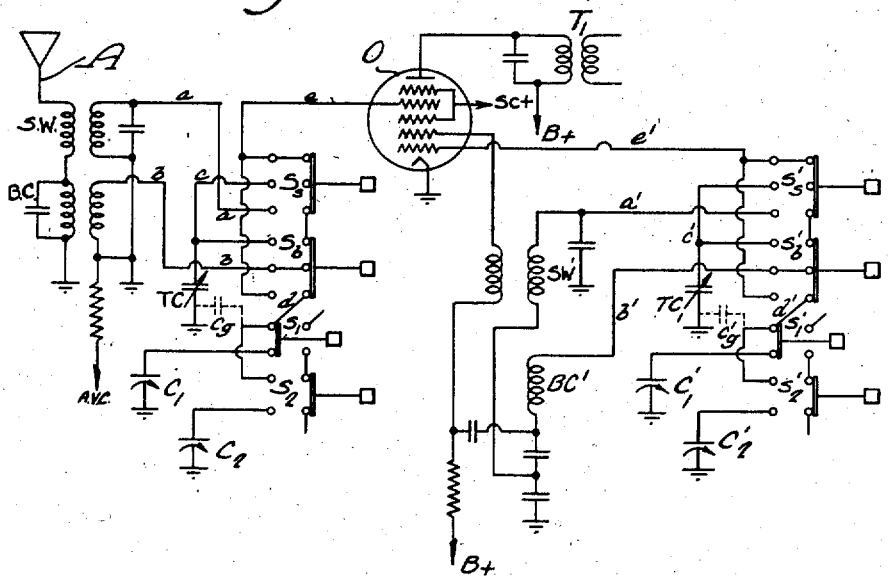
Fig. 6 is a diagrammatic illustration of another embodiment of the invention.
Figure 7:
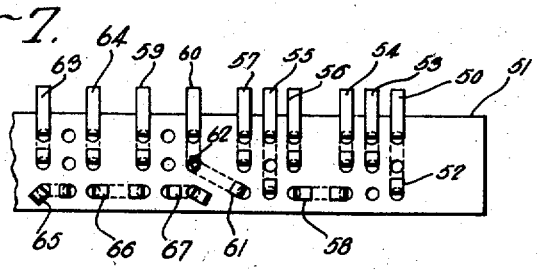
Fig. 7 is a plan view of the switch mechanism thereof.

In Figs. 6 and 7, there is illustrated an alternative form of the push button control mechanism. Fig. 6 shows a portion of the multi-band receiver and the control mechanism associated therewith, the push button control switches being shown in a slightly different manner from those of Fig. 1. The small circles represent the stationary contacts of the switches while, in each instance, the movable contact of a switch is shown as a contact bar which is adapted to engage one or the other of the two rows of contacts, depending upon whether the push button is in non-actuated position or in actuated position. Here again, the switches $S_s$ and $S_s'$ control the operation of the receiver in the short wave band, while the switches $S_b$ and $S_b'$ control the operation in the broadcast band. The switches $S_1$ and $S_2$ and their companion switches $S_1'$ and $S_2'$ are the station-selecting switches for use in the broadcast band. While only two sets of station-selecting switches are illustrated, any number of these switches may be employed. Further, although the two rows of switches are represented as separate rows of push button switches, they should preferably be arranged for operation in pairs, each pair of switches being controlled by a single push button, as described above in connection with Fig. 1.

The operation of this device is generally similar to the operation of the device of Fig. 1 and will be readily understood. In this instance also the station-selecting switches may control the energization of the dial lamp so that the dial lamp will be extinguished during push button tuning as above described, although the dial lamp circuit is not completely illustrated in Fig. 6. It will be understood also that the energization of the receiver may be controlled by a pushbutton switch in the manner illustrated in Fig. 1.

The push-button-controlled switches in Fig. 6 may be constructed in the same manner as described above in connection with the mechanical structures shown in Figs. 2 to 4. In Fig. 7, there is shown a plan view of one of the insulating strips and the stationary contacts carried thereby for forming one of the rows of switches. Each of the short wave switches comprises contact strips 50, 53 and 54 carried by the insulating strips 51. Each of the broadcast band switches comprises a long contact strip 55 inserted in the center row of holes and short contact strips 56 and 57 inserted in the two outer rows of holes. A connecting strip 58 is arranged as illustrated to connect the two adjacent wave band switches in the manner shown in Fig. 6.

Figure 8:
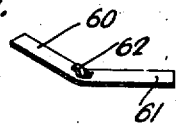
Fig. 8 is a perspective view of a special contact strip employed in this device.

Each of the station-selecting switches $S_1$ and $S_1'$ comprises a contact strip 59 and a special contact strip 60 (see Fig. 8), the portion 61 of which is obliquely disposed and serves as a connecting link between the first station-selecting switch and the broadcast band switch, as illustrated in Fig. 6. This contact strip has a turned up lug 62 which extends through one of the panel openings and is turned over to anchor the intermediate part of the strip.

Each of the other station selector switches comprises strips 62 and 64 arranged as illustrated. The strips 65, 66 and 67 may be employed to control the dial lamp circuit.

Referring to both Fig. 1 and Fig. 6, to eliminate the need for an additional switch to disconnect the BC transformer during short wave reception, the primary of said transformer is shunted by a condenser the value of which is such as to tune the primary coil to a frequency slightly below the broadcast band. This condenser serves to by-pass the primary coil to high frequencies so that switching is unnecessary.

It will be appreciated that one purpose of the switching arrangement herein disclosed is to connect the leads *b*, *d* and *e* (Figs. 1 and 6) to tune preselected stations, to connect the leads *b*, *c* and *e* for manual tuning in the broadcast band, and to connect *a*, *c* and *e* for manual tuning in the short wave band.

Further, it is desirable to eliminate the detrimental effect of the capacity to ground of the common lead *d*. This capacity is shown by the dotted condenser $C_g$. It will be understood that this capacity is present even though switches $S_1$ to $S_5$ are open and hence some means must be provided to disconnect this lead from the circuit.

In the circuit of Fig. 1, this is accomplished on the short wave band, by the series connections of *d* to *e* through the back contacts of $S_s$. Hence when $P_s$ is depressed the lead *d* is disconnected from the tuned circuit and the grid lead *e* is connected only to *a* and *c*. Shunting of the tuned circuit on the short wave band by the capacity to ground of *d* is thus avoided.

In the circuit of Fig. 6, this principle is extended to operate in both wave bands. In this figure the series connection includes the back contacts of both $S_s$ and $S_b$. Hence, if $P_s$ is depressed, the grid lead *e* is connected only to *a* and *c* and *d* is disconnected from the circuit, and if $P_b$ is depressed, grid lead *e* is connected only to *b* and *c* and *d* is again disconnected. However, if a button $P_1$, etc. is depressed then both $P_s$ and $P_b$ will be returned to their normal positions and *d* is connected to *e* and *b* through the back contacts of both $S_s$ and $S_b$.

It will be apparent that in both Figs. 1 and 6, it is necessary to connect *d* to *e* and *b* when both $S_5$ and $S_s$ are in the normal position. In Fig. 6 this is done by a circuit which disconnects *d* from the tuned circuit when either $P_s$ or $P_b$ is depressed. However, this arrangement requires the use of the special shaped connector of Fig. 8 or alternatively an extra external connection. By only disconnecting *d* from the tuned circuit in short wave reception as shown in Fig. 1, standard parts may be used which makes for economy but less satisfactory results.

From the above description, it will be seen that the invention provides a novel control device for a radio receiver or the like wherein a minimum of parts are used to obtain certain novel and desirable results without the addition of complexity or cost, and by means of which the receiver may be operated to receive signals in different wave bands by selective operation of push button elements, and the receiver may be tuned to stations in one of the frequency bands by means of station-selecting push button elements or the receiver may be tuned manually in the usual manner to stations in each of the frequency bands. Furthermore, the device automatically controls the energization of the usual dial lamp according to whether the receiver is tuned by means of the push buttons or by means of the tuning condensers. While two embodiments of the invention have been illustrated and described for the purpose of disclosure, it will be understood that the invention is capable of further modifications without departing from its scope as defined by the appended claims.

I claim:

1. In a radio receiver having tuning means including a dial and dial lamp, means operable at will for tuning said receiver to any one of a plurality of predetermined signals of different frequencies, said means including a plurality of selectable manually-operable elements, and a plurality of serially-connected switches in circuit with said lamp and operable respectively by said elements, each of said elements being constructed and arranged to close the associated lamp-control switch when in non-actuated position and to open the switch when in actuated position, whereby said dial lamp is rendered inoperative whenever any one of said elements is actuated and is rendered operative whenever all of said elements are in non-actuated position.

2. In a radio receiver having tuning means inincluding a dial and dial lamp, means operable at will for tuning said receiver to any one of a plurality of predetermined signals of different frequencies, including a plurality of tuned circuits for adapting said receiver for reception of said signals, a plurality of switches for selecting said tuned circuits, a plurality of selectable manually-operable elements constructed and arranged to close said switches when moved to actuated position, and a plurality of serially-connected switches in circuit with said lamp and operable respectively by said elements, each of said elements being constructed and arranged to close the associated lamp-control switch when in non-actuated position and to open the switch when in actuated position, whereby said dial lamp is rendered inoperative whenever any one of said elements is actuated and is rendered operative whenever all of said elements are in non-actuated position.

3. In a radio receiver having tuning means including a dial and dial lamp, an energizing circuit for said lamp, means operable at will for tuning said receiver to any one of a plurality of predetermined signals of different frequencies, including a plurality of tuned circuits for adapting said receiver for reception of said signals, and a plurality of two-position switches one for each of said tuned circuits, each of said switches being constructed and arranged to select its associated tuned circuit when moved to one position, and to close contacts serially included in the lamp-energizing circuit when moved to its other position, whereby said dial lamp is rendered inoperative whenever any one of said switches is moved to its circuit-selecting position and is rendered operative whenever all of said switches are in their other position.

4. In a radio receiver, a tuning condenser, a plurality of coils tunable by said tuning condenser to wave signals in different frequency bands, a dial and dial lamp for indicating the tuning of the receiver, a signal transfer channel, a plurality of adjustable tuning elements, a plurality of switches constructed and arranged to select said tuning elements and to render said lamp inoperative whenever one of said elements is selected, a common connector for said switches, and means including at least one two-position switch for connecting said common connector and one of the coils to said channel, or alternatively connecting said tuning condenser and a selected one of said coils to said channel, means for latching any one of the aforesaid switches in actuated position, and means for moving an actuated switch to non-actuated position whenever another switch is actuated.

5. In a radio receiver, a tuning condenser, a coil tunable by said tuning condenser to wave signals in a certain frequency band, a signal transfer channel, a plurality of adjustable tuning elements, a plurality of switches connected respectively to said tuning elements for selective operation thereof, a common connector for said switches, a two-position switch constructed and arranged to connect said tuning condenser and said coil to said transfer channel when in actuated position, and to connect said coil and said common connector to said channel when in non-actuated position, means for latching any one of the aforesaid switches in actuated position, and means for moving an actuated switch to non-actuated position whenever another switch is actuated.

6. In a radio receiver, a tuning condenser, a coil tunable by said tuning condenser to wave signals in a certain frequency band, a space discharge device having an input element, a plurality of pretunable circuits including adjustable tuning elements, a plurality of switches connected respectively to said tuning elements for selective operation of said pretunable circuits, a common connector for said switches, means including a two-position switch for conecting said tuning condenser and said coil to said input element, or alternatively connecting said common connector to said input element, means for latching any one of the aforesaid switches in actuated position, and means for moving an actuated switch to non-actuated position whenever another switch is actuated.

7. In a radio receiver, a tuning condenser, a plurality of coils tunable by said tuning condenser to wave signals in different frequency bands, a signal transfer channel, a plurality of adjustable tuning elements, a plurality of switches connected respectively to said tuning elements for selective operation thereof, a common connector for said switches, a plurality of two-position switches corresponding respectively to said coils, and movable selectively from non-actuated position to actuated position, said two-position switches being constructed and arranged to connect said common connector and one of the coils to said channel when the two-position switches are in non-actuated position, and to connect said tuning condenser and one of the coils to said channel and disconnect said common connector when one of the switches is moved to actuated position, means for latching any one of the aforesaid switches in actuated position, and means for moving an actuated switch to non-actuated position whenever another switch is actuated.

8. In a radio receiver, a tuning condenser, a plurality of coils tunable by said tuning condenser to wave signals in different frequency bands, a signal transfer channel, a plurality of adjustable tuning elements, a plurality of switches connected respectively to said tuning elements for selective operation thereof, a common connector for said switches, means including at least one two-position switch for connecting said common connector and one of the coils to said channel or alternatively connecting said tuning condenser and a selected one of said coils to said channel, means for latching any one of the aforesaid switches in actuated position, and means for moving an actuated switch to non-actuated position whenever another switch is actuated.

9. In a multi-band radio receiver, a tuning condenser, a plurality of coils tunable by said tuning condenser to wave signals in different frequency bands, a space discharge device having an input element, a switch constructed and arranged to connect one of said coils, said tuning condenser and said input element in shunt relation with one another when the switch is in actuated position, another switch constructed and arranged to connect another of said coils, said tuning condenser and said input element in shunt relation with one another when the switch is in actuated position, a plurality of adjustable tuning condensers, a plurality of switches connected respectively to said last-mentioned condensers for rendering such condensers selectively operable, a common connection for said last-mentioned switches, a connection through at least one of said first-mentioned switches in its non-actuated position for connecting said common connection to one of said coils and to said input element, means for latching any one of said switches in actuated position, and means for moving an actuated switch to non-actuated position whenever another switch is actuated.

10. In a multi-band receiver, a tuning condenser, a plurality of coils tunable by said tuning condenser to wave signals in different frequency bands, a signal transfer channel, a plurality of pretunable elements, a plurality of switches each having a normal and an actuated position and each connected to said pretunable elements and to a common connection, a first wave band switch having a normal and an actuated position, connections to said first wave band switch for connecting said tuning condenser and one of said coils to said signal channel when said switch is in actuated position, a second wave band switch having a normal and an actuated position, connections to said second wave band switch for connecting said tuning condenser and the other of said coils to said signal channel when said second switch is in actuated position, connections to both of said switches for connecting said signal channel and one of said coils to said common connection when both of said wave band switches are in normal position, and for disconnecting said common connection from said signal channel when one of said wave band switches is actuated, and a mechanical interlock for moving the other of said switches to normal position when any one of said switches is moved to its actuated position.

11. A radio receiver having a first tuning means including a dial and dial lamp for tuning said receiver to wave signals in different frequency bands, a second tuning means operable at will for tuning said receiver to any one of a plurality of predetermined signals within one wave band, said first tuning means including a first group of selectable manually operable elements, said second tuning means including a second group of selectable manually operable elements, and means for automatically rendering one of said tuning means inoperative whenever the other tuning means is actuated.

12. A radio receiver having a first tuning means for tuning said receiver to wave signals in different frequency bands, a second tuning means for tuning said receiver to any one of a plurality of predetermined signals, said first tuning means including a first group of selectable manually operable elements, said second tuning means including a second group of selectable manually operable elements, and electric circuit means for automatically rendering one of said tuning means inoperative whenever the other tuning means is actuated.

13. A radio receiver having a first tuning means for tuning said receiver to wave signals in different frequency bands, a second tuning means operable at will for tuning said receiver to any one of a plurality of predetermined signals within one wave band, said first tuning means including a first group of selectable manually operable elements, said second tuning means including a second group of selectable manually operable elements, and electric circuit means for automatically rendering one of said tuning means inoperative whenever the other tuning means is actuated.

14. A multi-band radio receiver, comprising selectable circuit means for the reception of signals in different frequency bands, a plurality of push-button operated switches for selectively controlling said circuit means, a plurality of selectable pretuned elements for tuning the receiver to predetermined signals in a particular wave band, a relatively high capacity common circuit connector for said elements adapted to be completed by said switches in their non-actuated positions, a plurality of push-button operated switches for selectively connecting said pretuned elements to said common connector, and means for maintaining any one of the aforesaid push-button switches in operated position, and for releasing any operated switch whenever another switch is actuated, said first switches serving to disconnect said high capacity common conductor when the same is not in use.

15. In a radio receiver, a plurality of push-button elements selectively depressible for operation of the receiver in different frequency bands one of which is the broadest band, circuit means rendered operative only when one of said elements is depressed to condition the receiver for manual tuning within the frequency band to which the depressed element corresponds, a plurality of push-button elements corresponding to preselected frequencies in the broadcast band, interlocking circuit means rendered operative only when the first-mentioned push-button elements are in non-actuated position and operable by said last-mentioned push-button elements to tune the receiver automatically to one of said preselected frequencies, and interlocking mechanical means for restoring any depressed push-button element to its non-actuated position whenever any other push-button element is depressed, whereby the receiver may be conditioned for manual tuning in any one of said frequency bands or may be tuned automatically to a preselected frequency in the broadcast band by the actuation of a single push-button element.

16. In a radio receiver, a plurality of push-button elements selectively depressible for operation of the receiver in different frequency bands, manual tuning means for said receiver, circuit means controlled by said push-button elements for rendering said tuning means operative only when one of said elements is depressed, thereby to condition the receiver for manual tuning within the frequency band to which the depressed element corresponds, a plurality of push-button elements corresponding to preselected frequencies within one of said frequency bands, pretuned elements selectable by said last-mentioned push-button elements for automatically tuning the receiver to said preselected frequencies in said one band, interlocking circuit means for rendering said pretuned elements operative only when the first-mentioned push-button elements are in non-actuated position, and interlocking mechanical means for restoring any depressed push-button element to its non-actuated position whenever any other push-button element is depressed, whereby the receiver may be conditioned for manual tuning in any one of said frequency bands or may be tuned automatically to one of said preselected frequencies by the actuation of a single push-button element.

17. In a radio receiver, a plurality of push-button switches selectively depressible for operation of the receiver in different frequency bands, said switches having contacts at their non-actuated and actuated positions, circuit means controlled by the contacts at the actuated positions of said switches to condition the receiver for manual tuning within the frequency band to which the actuated switch corresponds, a plurality of push-button switches corresponding to preselected frequencies within one of said frequency bands, pretuned elements selectable by said last-mentioned switches for tuning the receiver automatically to said preselected frequencies, a common circuit connector for said elements connected to the contacts at the non-actuated positions of said first-mentioned switches so as to render said elements operative only when said first-mentioned switches are in non-actuated position, and means for restoring any actuated one of the aforesaid switches to its non-actuated position whenever any other switch is actuated, whereby the receiver may be conditioned for manual tuning in any one of said frequency bands or may be tuned automatically to one of said preselected frequencies by the actuation of a single push-button switch.

ROBERT B. ALBRIGHT.